United States Patent [19]

Shumate et al.

[11] Patent Number: 5,137,610
[45] Date of Patent: Aug. 11, 1992

[54] SPUTTER CHAMBER WITH EXTENDED PROTECTION PLATE AND METHOD OF USE

[75] Inventors: David A. Shumate, Phoenix; Thomas R. Baker, Tempe; Robert W. Gray, Mesa, all of Ariz.

[73] Assignee: Motorola, Inc., Schaumburg, Ill.

[21] Appl. No.: 684,757

[22] Filed: Apr. 15, 1991

[51] Int. Cl.$^5$ .................................................. C23F 4/04
[52] U.S. Cl. ............................ 204/192.32; 204/192.37; 204/298.31
[58] Field of Search .................. 204/192.32, 192.37, 204/298.31, 298.34

[56] References Cited

U.S. PATENT DOCUMENTS 3,598,710  8/1971  Davidse ...................... 204/192.37

OTHER PUBLICATIONS

G. J. Kominiak et al, *J. Vac. Sci. Technol.* vol. 13, No. 6, Nov./Dec. 1976, pp. 1193–1194.

*Primary Examiner*—Aaron Weisstuch
*Attorney, Agent, or Firm*—Eugene A. Parsons

[57] ABSTRACT

A sputter chamber with a rotatably mounted cathode nested in spacers, formed of the material sold under the trademark Teflon, and a quartz plate defining wafer receiving openings therethrough and affixed to the flat upper surface of the cathode in overlying relationship with the cathode and any exposed spacers to prevent sputtering of the spacers. If the material sold under the Trademark Teflon is sputtered fluorine containing ions are produced in the chamber plasma, which chemically etch masking materials such as titanium tungsten.

5 Claims, 2 Drawing Sheets

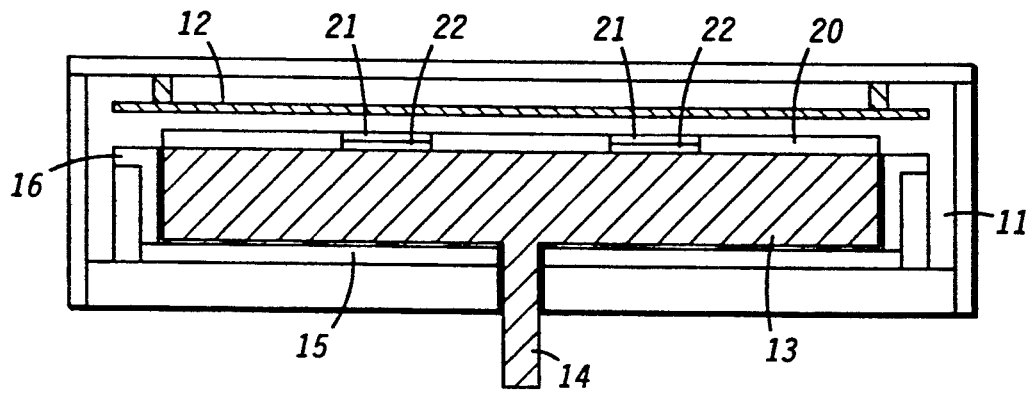
FIG. 1
-PRIOR ART-
FIG. 2
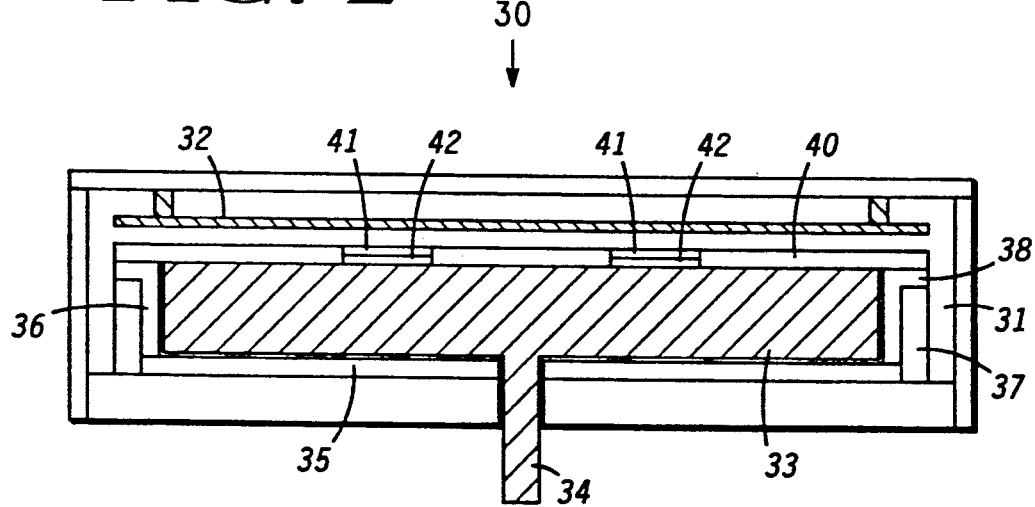

SPUTTER CHAMBER WITH EXTENDED PROTECTION PLATE AND METHOD OF USE

The present invention pertains to sputter chambers and more specifically to sputter chambers having a cathode nested in spacers formed of a dielectric material such as the material sold under the trademark Teflon.

BACKGROUND OF THE INVENTION

In the semiconductor industry many sputter etch machines are utilized to remove selected portions of metallization layers. Generally the metallization layer, which may be for example gold, has selected portions masked by some material having a high resistance to sputtering, such as titanium tungsten. To perform the sputter etch procedure one or more semiconductor wafers is positioned on the cathode of the sputter etch machine and essentially acts as the sputtering target. The gold is removed (sputtered) wherever it is not masked by the titanium tungsten.

In the prior art sputter etch machines a quartz plate is positioned in overlying relationship to the cathode to protect the cathode from sputtering also. Generally, the cathode is constructed of some good electrical conductor, such as stainless steel or aluminum alloy, which will sputter relatively easily and contaminate the sputtered gold, thereby, adversely affecting the etching thereof. The quartz plate is constructed coextensive with the cathode and has openings therethrough for receiving the semiconductor wafers therein so that when wafers are properly positioned in the openings, the entire exposed upper surface of the cathode is covered.

The major problem with this procedure is that on occasion the titanium tungsten masking layer is etched through, resulting in the underlying gold being removed in undesired areas. The rejection rate of semiconductor wafers directly attributable to this problem is as high as 10%. This is an especially important problem because the gold sputtering procedure occurs near the end of the fabrication process and each reject means that all of the foregoing time and expense has been wasted. This is, therefore, a serious problem in the semiconductor industry.

SUMMARY OF THE INVENTION

It is an intention of the present invention to substantially reduce sputtering rejects in sputter chambers.

It is a further intention of the present invention to substantially reduce rejects of semiconductor wafers sputter etched in sputter chambers which have Teflon, or similar dielectric material, spacers.

These and other intentions are realized in a sputter chamber including a cathode having a flat upper surface with a lower surface and cylindrically shaped sides rotatably mounted in nesting relationship in one or more spacers, formed of a spacer material, designed to operate as an electrical spacer to insulate the cathode from the sides of the chamber and as a bearing on the bottom and sides of the cathode to enhance the rotation thereof, a plate of inert material, which does not participate in the sputtering, fitting in the sputter chamber in parallel overlying relationship to the flat upper surface of the cathode for rotation therewith, the plate being designed to overly and protect at least upper exposed surfaces of the spacers to substantially prevent sputtering of the spacers, the plate defining a plurality of openings therethrough with each opening being designed to receive a semiconductor wafer therein in flat electrical and mechanical contact with the flat upper surface of the cathode.

BRIEF DESCRIPTION OF THE DRAWINGS

Referring to the drawings:

FIG.1 is a sectional view taken substantially through the center of a prior art sputter etch chamber;

FIG.2 is a sectional view taken substantially through the center of a sputter chamber embodying the present invention.

DESCRIPTION OF THE PREFERRED EMBODIMENT

Figure 3:
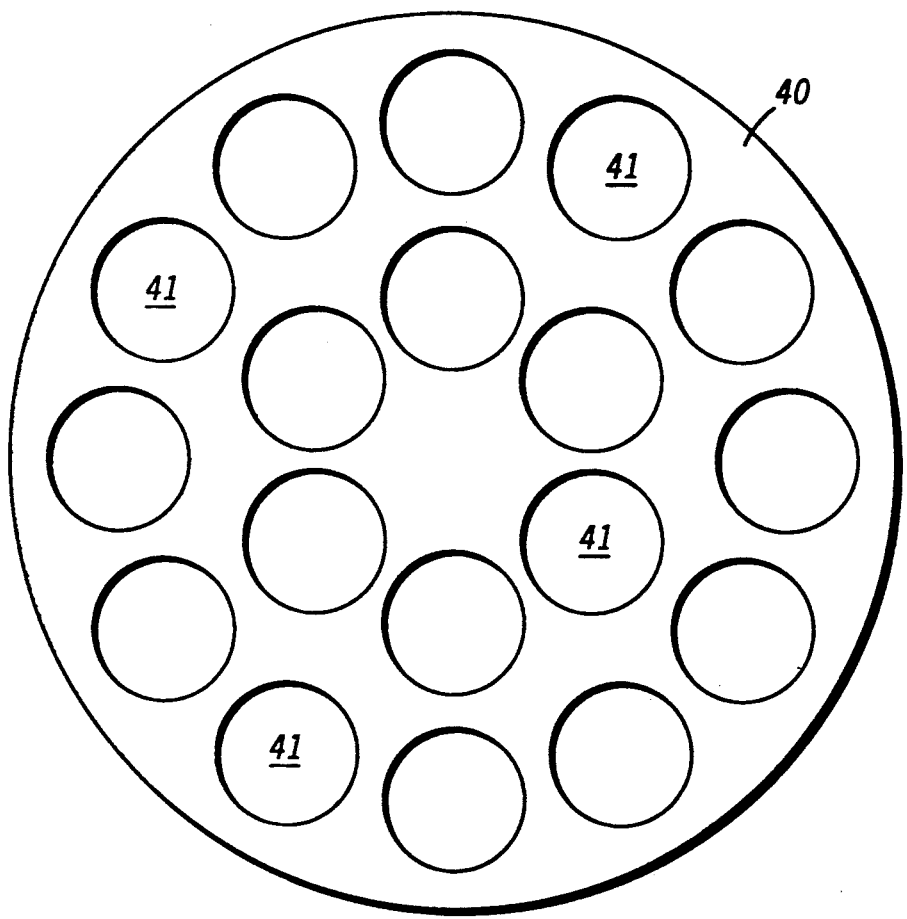
FIG.3 is a view in top plan of a quartz plate included in the sputter chamber of FIG. 2.

Referring specifically to FIG. 1, a prior art sputter etch chamber 10 is illustrated. Chamber 10 defines a generally cylindrical cavity 11 wherein the procedure of sputter etching is performed. An anode 12 is mounted in parallel with and in spaced relation from the upper surface of cavity 11. A cathode 13 is positioned within cavity 11 in spaced relation from anode 12 and the bottom and sides of cavity 11. Cathode 13 is rotatably mounted, by means of an integral shaft 14 which extends outwardly through an exterior opening in the bottom of sputter etch chamber 10. The mounting and means of rotation of cathode 13 are well known to those skilled in the art and, therefore, will not be discussed in detail herein.

A flat spacer 15, formed of the material sold under the trademark Teflon, or similar material, is positioned in cavity 11 beneath cathode 13 to electrically insulate cathode 13 from the bottom of cavity 11. "Teflon" is a registered trademark of E. I. DuPont De Nemours & Company and applies to a well known material completely defined in the literature. A second, generally cylindrical spacer 16, constructed of the same material as spacer 15, is constructed to rest on spacer 15 and surround the sides of cathode 13. It should be noted that spacers 15 and 16 may and they are illustrated as two spacers in the present disclosure because of the ease of construction. First and second spacers 15 and 16 not only electrically insulate the relatively high voltage cathode from the bottom and sides of cavity 11 but also act as bearing surfaces to enhance the rotation of cathode 13. Besides being a good electrical insulator for very high voltages and a smooth bearing surface, it was thought that, because the material of spacers 15 and 16 is a relatively inert material, spacer 16 would protect the sides of the cathode from sputtering and not participate in the chemistry of the etching.

A quartz plate 20 is positioned in overlying relationship on the flat upper surface of cathode 13 and is coextensive therewith. A plurality of openings 21 are provided in quartz plate 20 for receiving semiconductor wafers 22. When a wafer 22 is properly positioned in an opening 21 the wafer is electrically and mechanically in contact with the upper surface of cathode 13 so that wafers 22 essentially act as the target of the sputter etch chamber 10. Material is, therefore, removed from the surfaces of wafers 22 and deposited on anode 12. With a wafer 22 positioned in each opening 21 in quartz plate 20, the entire upper surface of cathode 13 is covered. Since the sides of cathode 13 are covered by spacer 16, it was believed that sputtering of cathode 13 would be prevented.

Through careful observation and experimentation it has been discovered that in fact exposed spacers in the sputter etch chamber are sputtered and release fluorine ions into the plasma chemistry in the sputter etch chamber. These fluorine ions in the plasma effect a chemical etch on the titanium tungsten masking layer, in some instances etching through the titanium tungsten masking layer and, thereby, resulting in the removal of the gold thereunder. The chemical etch of the titanium tungsten mask layer during gold sputter etching decreased the etch selectivity between the gold and the titanium tungsten. The requirement of a masked etch is selectivity between the etched layer and the masked layer. Since the titanium tungsten layer is being etched, the available sputter time for the gold is limited by the time that the mask layer remains, and as the 5 selectivity and sputter time decrease, the wafer yield decreases.

Referring to FIG. 2, a sputter chamber 30 embodying the present invention is illustrated. Sputter chamber 30 may be a sputter etch chamber or any other chamber confining plasma generated species, all of which are included herein by the general term "sputter chamber". Sputter chamber 30 defines a cavity 31 having an anode 32 mounted parallel with and in spaced relation, from the upper surface thereof. A cathode 33 is mounted adjacent the lower surface of cavity 31, for rotation about an integrally formed axle 34. A first spacer 35 is formed of a dielectric insulator, such as the material sold under the trademark Teflon or any similar material, all of which will be referred to herein under the general term "spacer material". First spacer 35 is essentially a flat plate positioned between the lower surface of cavity 31 and the lower surface of cathode 33. A second, generally cylindrical spacer 36, formed of spacer material, is positioned so as to surround and be spaced axially from the sides of cathode 33. Cathode 33 is nestingly positioned in spacers 35 and 36 so as to be substantially surrounded and protected on the bottom and sides thereof. A cylindrical wall 37 extends upwardly from the lower wall of chamber 30 in supporting relationship to spacer 36, with an outwardly extending lip 38 on the upper edge of spacer 36 engaging the upper edge of wall 37.

A protection plate 40, which is constructed of some convenient inert material which does not participate in sputtering, is positioned in overlying relationship to the flat upper surface of cathode 33 for rotation therewith. In the present embodiment protection plate 40 is constructed of quartz. Quartz plate 40 extends radially outwardly beyond the edges of cathode 33 to the outer edges of lip 38 on spacer 36. Thus, the exposed surfaces of spacer 36 are covered and sputtering thereof is substantially prevented. It should be noted that the radially outwardly extending edges of lip 38 of spacer 36 are not covered in the illustrated embodiment. It is believed that spacer 36 is sufficiently thin so that no substantial surface area is exposed for sputtering with this embodiment. However, if a thicker spacer is utilized and a sufficiently large area of the side is exposed, quartz plate 40 can be formed with a downwardly extending lip along the outer edge thereof to cover this exposed surface. It is also possible that cylindrical wall 37 could be constructed so that very little radially outwardly directed surface of spacer 36, or lip 38, is exposed.

Quartz plate 40 has a plurality of openings 41 formed therethrough, each adopted to have positioned therein a semiconductor wafer 42. Referring to FIG. 3, a top plan of quartz plate 40 is illustrated having eighteen openings 41 formed therethrough. In this particular embodiment openings 41 are designed to receive eighteen three inch diameter semiconductor wafers therein, although it will be understood that quartz plate 40 could be constructed to receive substantially any desired wafer size, or any semiconductor chips.

In the operation of sputter chamber 30, eighteen semiconductor wafers 42 are placed in the eighteen openings 41 so as to lie flat on the upper surface of cathode 33 in electrical and mechanical contact therewith. The eighteen semiconductor wafers may have, for example, a gold metallization layer masked in selected portions by a titanium tungsten mask layer. Since the eighteen semiconductor wafers 42 and quartz plate 40 cover substantially the entire upper surface of cathode 33 and spacer 36, there is no sputtering of cathode 33 or spacer 36. Therefore, only the unmasked gold metallization layers on the eighteen semiconductor wafers 42 are sputtered. Since the spacers 35 and 36 are substantially covered, no sputtering of the spacers 35 and 36 occurs and no fluorine ions are produced to chemically etch the titanium tungsten masking layers on the semiconductor wafers.

Thus, a new and improved sputter chamber has been disclosed, which chamber includes a new and novel construction so that spacers formed of spacer material and utilized therein are not inadvertently sputtered. Specifically titanium tungsten over a metallization layer, such as gold, is not affected or chemically etched when utilized as a masking layer on semiconductor wafers. The use of this novel sputter chamber by the inventors resulted in no failures of the mask and, consequently, a zero scrap rate from the sputter etching process.

While we have shown and described specific embodiments of the present invention, further modifications and improvements will occur to those skilled in the art. We desire it to be understood, therefore, that this invention is not limited to the particular forms shown and we intend in the append claims to cover all modifications that do not depart from the spirit and scope of this invention.

What is claimed is:

1. In a sputter chamber including a cathode having a flat upper surface with a lower surface and cylindrically shaped sides rotatably mounted in nesting relationship in one or more spacers, formed of dielectric material, designed to operate as an electrical spacer to insulate the cathode from the sides of the chamber and as a bearing on the bottom and sides of the cathode to enhance the rotation thereof, a protection plate of inert material, which does not participate in sputtering, fitting in the sputter chamber in parallel overlying relationship on the flat upper surface of the cathode for rotation therewith, said protection plate being designed to overlie and protect exposed surfaces of the spacers to substantially prevent sputtering of the spacers, said protection plate defining a plurality of openings therethrough with each opening being designed to receive a semiconductor wafer therein in flat electrical and mechanical contact with the flat upper surface of the cathode.

2. A sputter chamber as claimed in claim 1 wherein the plate is composed substantially of quartz.

3. In a sputter chamber including a cathode having a flat upper surface with a lower surface and cylindrically shaped sides rotatably mounted in nesting relationship in one or more spacers, formed of a dielectric material, designed to operate as an electrical spacer to insulate the cathode from the sides of the chamber and as a bearing on the bottom and sides of the cathode to enhance the rotation thereof, a quartz plate for providing selective etching of a metallization layer on semiconductor wafers masked with a titanium tungsten layer, said quartz plate fitting in the sputter chamber in parallel overlying relationship to the flat upper surface of the cathode for rotation therewith, said quartz plate defining a plurality of openings therethrough with each opening being designed to receive a semiconductor wafer therein in flat electrical and mechanical contact with the flat upper surface of the cathode, and said quartz plate being further designed to overlie and protect exposed surfaces of the spacers to substantially prevent sputtering of the spacers and prohibiting the spacer material from dissociating and becoming part of the plasma chemistry.

4. In a sputter chamber including a cathode having a flat upper surface with a lower surface and cylindrically shaped sides rotatably mounted in nesting relationship in one or more spacers, formed of a dielectric material, designed to operate as an electrical spacer to insulate the cathode from the sides of the chamber and as a bearing on the bottom and sides of the cathode to enhance the rotation thereof, a method of selectively removing portions of a metallization layer on a semiconductor substrate masked in selected places by a substantially non-sputtering masking layer, comprising the steps of:

providing a protection plate of inert material, which does not participate in sputtering, in overlying relationship over the cathode of the sputter etch chamber so as to rotate with the cathode and to overlie and protect exposed surfaces of the spacers, said protection plate defining a plurality of openings therethrough, each opening being designed to receive a semiconductor wafer therein;

placing a semiconductor wafer in each opening of said protection plate, each semiconductor wafer including a metallization layer masked in selected areas by a substantially non-sputtering mask; and activating the sputter chamber to remove unmasked portions of the metallization layer on each semiconductor wafer without sputtering the spacers, so that chemical components of the spacers do not participate in the chemistry of the plasma.

5. In a sputter chamber including a cathode having a flat upper surface with a lower surface and cylindrically shaped sides rotatably mounted in nesting relationship in one or more spacers, formed of a dielectric material, designed to operate as an electrical spacer to insulate the cathode from the sides of the chamber and as a bearing on the bottom and sides of the cathode to enhance the rotation thereof, a method of selectively removing portions of a metallization layer on a semiconductor substrate masked in selected places by a titanium tungsten masking layer, comprising the steps of:

providing a quartz plate in overlaying relationship to the cathode of the sputter etch chamber so as to rotate with the cathode and to overlie and protect exposed surfaces of the spacers, said quartz plate defining a plurality of openings therethrough, each opening being designed to receive a semiconductor wafer therein;

placing a semiconductor wafer in each opening of said quartz plate, each semiconductor wafer including a metallization layer masked in selected areas by a titanium tungsten mask; and activating the sputter chamber to remove unmasked portions of the metallization layer on each semiconductor wafer without sputtering the spacers and the masking layer.

* * * * *